(12) United States Patent
Azuma et al.

(10) Patent No.: US 6,754,064 B2
(45) Date of Patent: Jun. 22, 2004

(54) MOUNTING STRUCTURE FOR TWO-TERMINAL CAPACITOR AND THREE-TERMINAL CAPACITOR

(75) Inventors: Takahiro Azuma, Fukui (JP); Hidetoshi Yamamoto, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/384,661

(22) Filed: Mar. 11, 2003

(65) Prior Publication Data

US 2004/0008470 A1 Jan. 15, 2004

(30) Foreign Application Priority Data

Mar. 26, 2002 (JP) ........................................ 2002-086346

(51) Int. Cl.[7] ................................................ H01G 4/35
(52) U.S. Cl. ...................... 361/302; 361/303; 361/305; 361/306.1; 361/306.3; 361/313
(58) Field of Search ................................. 361/302, 303, 361/305, 308.1, 311, 313, 321.1, 321.4, 306.1, 306.3, 321.6, 320, 760, 761

(56) References Cited

U.S. PATENT DOCUMENTS 5,745,333 A * 4/1998 Frankeny et al. ........... 361/313
6,418,007 B1 * 7/2002 Lacy et al. ................ 361/301.1
6,542,352 B1 * 4/2003 Devoe et al. ............. 361/321.2
6,646,858 B2 * 11/2003 Dingenotto et al. ......... 361/302
6,678,145 B2 * 1/2004 Naito et al. .............. 361/308.1

* cited by examiner

Primary Examiner—Dean A. Reichard
Assistant Examiner—Nguyen T. Ha
(74) Attorney, Agent, or Firm—Keating & Bennett, LLP

(57) ABSTRACT

A mounting structure for a two-terminal capacitor or a three-terminal capacitor includes a hot conductor pattern, to which first external terminals of two-terminal capacitors are electrically connected, and grounding conductor patterns, to which second external terminals are electrically connected, which are provided on the surface of a circuit board. The two-terminal capacitors are mounted so that the capacitors may be positioned to be symmetrical with respect to the hot conductor pattern. A grounding conductor pattern is also provided inside the circuit board and electrically connected to the grounding conductor patterns by the through-holes provided in the circuit board. A common through-hole is disposed in the grounding conductor pattern G so as to be substantially the same distance from the through-holes.

30 Claims, 15 Drawing Sheets

MOUNTING STRUCTURE FOR TWO-TERMINAL CAPACITOR AND THREE-TERMINAL CAPACITOR

BACKGROUND OF THE INVENTION

1. Field of the Invention

The present invention relates to a mounting structure for a two-terminal capacitor and three-terminal capacitor.

2. Description of the Related Art

Up to now, in order to reduce the equivalent series inductance of a two-terminal capacitor for eliminating noise current used in power supply lines of high-speed ICs, for example, as shown in FIG. 15, a plurality of two-terminal capacitors 1A and 1B are mounted on a circuit board 30 such that the two-terminal capacitors 1A and 1B are electrically connected in parallel between a hot conductor pattern 60 and a grounding conductor pattern G11. That is, when the equivalent series inductance is required to be one half, two two-terminal capacitors are mounted in parallel and, when it is required to be one third, three two-terminal capacitors are mounted in parallel. Moreover, in FIG. 15, arrows Ia and Ib represent the direction in which the noise currents flow in the capacitors 1A and 1B.

Accordingly, in order to realize a lower equivalent series inductance, many capacitors are required to be mounted on the circuit board 30 and a large mounting space is necessary, which is one factor of high cost.

SUMMARY OF THE INVENTION

In order to overcome the problems described above, preferred embodiments of the present invention provide a mounting structure for a two-terminal capacitor and three-terminal capacitor, in which the equivalent series inductance of the capacitors is greatly reduced and the mounting space required is small and which is very low cost.

In a two-terminal capacitor mounting structure according to a preferred embodiment of the present invention, at least two two-terminal capacitors, each having a chip element and a first external terminal and a second external terminal provided on both ends of the chip element respectively, are mounted on a circuit board having a first conductor pattern and at least two second conductor patterns arranged so as to interpose the first conductor pattern therebetween. In the two-terminal capacitor mounting structure, the two two-terminal capacitors are arranged so that noise currents flowing in the two two-terminal capacitors may be in opposite direction to each other with respect to the first conductor pattern or the sum of directional vectors of the noise currents may be zero such that the first external terminal of each of the at least two two-terminal capacitors is electrically connected to the first conductor pattern, such that the second external terminal of one of the two two-terminal capacitors is electrically connected to one of the two second conductor patterns, and such that the second external terminal of the other two-terminal capacitor is electrically connected to the rest of the two second conductor patterns.

According to the above-described unique construction, the noise currents (high-frequency currents) flowing in the two two-terminal capacitors become opposite in direction relative to each other. Therefore, the magnetic fields generated by these noise currents cancel each other out. As a result, the equivalent series inductance generated by the two two-terminal capacitors is greatly reduced and minimized to substantially less than one third.

Furthermore, in a two-terminal capacitor mounting structure according to a preferred embodiment of the present invention, a grounding conductor pattern is arranged so that noise currents flowing in the grounding conductor pattern and noise currents flowing in the two-terminal capacitors may be in opposite direction to each other or the sum of directional vectors of the noise currents may be zero in such a manner that the grounding conductor pattern is provided at least either inside the circuit board or on the rear surface of the circuit board and such that the grounding conductor pattern is electrically connected to one of the first conductor pattern and second conductor patterns and to grounding external terminals of the two-terminal capacitors through an electrical connector provided inside the circuit board.

According to the above-described unique construction, noise current flowing in an opposite direction relative to the noise current flowing in the two-terminal capacitors flows in the grounding conductor pattern provided inside the circuit board or on the rear surface of the circuit board. Therefore, the magnetic fields generated by these noise currents cancel each other out. As a result, the total equivalent series inductance of the two-terminal capacitors and the circuit board is greatly reduced.

Furthermore, in a three-terminal capacitor mounting structure according to a preferred embodiment of the present invention, a three-terminal capacitor, which has a chip element, through electrodes provided inside the chip element, internal electrodes arranged so as to face the through electrodes, a first external terminal and a second external terminal provided on both ends of the chip element respectively and electrically connected to the through electrodes, and third external terminals provided on side surfaces of the chip element and electrically connected to the internal electrodes, is mounted on a circuit board having hot conductor patterns and a grounding conductor pattern. In the three-terminal capacitor mounting structure, the three-terminal capacitor is mounted on the circuit board and the grounding conductor pattern is arranged so that noise currents flowing in the grounding conductor pattern and noise currents flowing in the three-terminal capacitor may be in opposite direction to each other such that the first external terminal and the second external terminal are electrically connected to the hot conductor patterns in the three-terminal capacitor, such that the grounding conductor pattern is provided either inside the circuit board or on the rear surface of the circuit board, and such that the grounding conductor pattern is electrically connected to the third terminals of the three-terminal capacitor through an electrical connector provided inside the circuit board.

Alternatively, in a three-terminal capacitor mounting structure, the three-terminal capacitor is mounted on the circuit board and the hot conductor patterns are arranged so that noise current in the hot conductor pattern and noise currents flowing in the three-terminal capacitor may be in opposite direction to each other such that the third external terminals are electrically connected to the grounding conductor pattern in the three-terminal capacitor, such that the hot conductor patterns are provided either inside the circuit board or on the rear surface of the circuit board, and such that the hot conductor patterns are electrically connected to the first external terminal and the second external terminal through an electrical connector disposed inside of the circuit board.

According to the above-described unique construction, noise current flowing in an opposite direction relative to the noise current flowing in the three-terminal capacitor flows in the grounding conductor pattern and the hot conductor patterns provided inside the circuit board or on the rear surface of the circuit board. Therefore, the magnetic fields generated by these noise currents cancel each other out. As a result, the total equivalent series inductance of the three-terminal capacitor and the circuit board is greatly reduced.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Hereinafter, preferred embodiments of a mounting structure for capacitors according to the present invention will be described with reference to the accompanying drawings. First Preferred Embodiment, FIGS. 1 to 5

Figure 1:
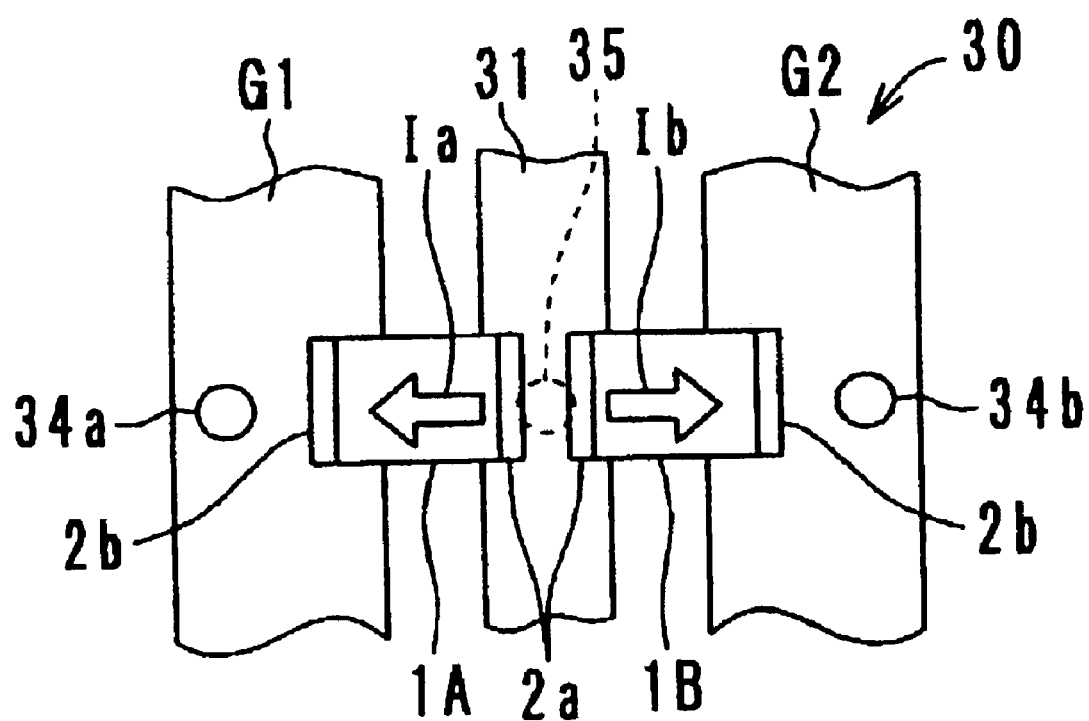
FIG. 1 is a top view showing a first preferred embodiment of a mounting structure of capacitors according to the present invention.
Figure 2:
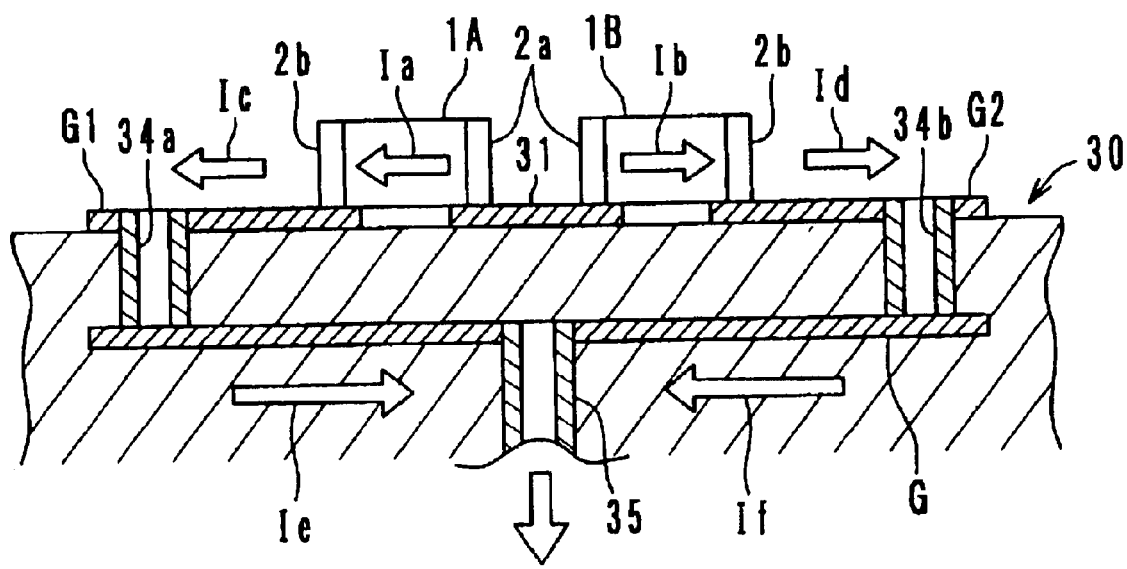
FIG. 2 is a sectional view of the mounting structure of capacitors in FIG. 1.

FIG. 1 is a top view showing a preferred embodiment of a two-terminal mounting structure to be used for eliminating noise current in the power line in high speed ICs, and FIG. 2 is a sectional view thereof. Lamination type two-terminal capacitors 1A and 1B are mounted on the surface of a circuit board 30 by soldering or other suitable process.

In the lamination type two-terminal capacitors 1A and 1B, a first external terminal 2a and a second external terminal 2b are provided on both ends of a dielectric ceramic element (chip element) preferably having the form of a substantially rectangular solid which is preferably made of a ceramic material, respectively, and a plurality of internal electrodes are provided inside the ceramic element.

The circuit board 30 is preferably a ceramic board made of a dielectric material. On its surface, a hot conductor pattern (first conductor pattern) 31 to which the first external terminals 2a and 2a of the two two-terminal capacitors 1A and 1B are electrically connected and grounding conductor patterns (second conductor patterns) G1 and G2 to which the second external terminals 2b and 2b are electrically connected respectively are provided. The grounding conductor patterns G1 and G2 are arranged so as to interpose the hot conductor pattern 31 therebetween. The two two-terminal capacitors 1A and 1B are mounted such that the capacitors 1A and 1B face each other so as to be symmetrical with respect to the hot conductor pattern 31.

Furthermore, a grounding conductor pattern G is provided inside the circuit board 30 and electrically connected to the grounding conductor patterns G1 and G2 by the through-holes 34a and 34b provided in the circuit board 30. The grounding conductor pattern G may be a line with a relatively small conductor width or may be a large flat area. In the grounding conductor pattern G, a common through-hole 35 is disposed at a location which is substantially equal in distance from the through-holes 34a and 34b and substantially in the middle of the two two-terminal capacitors 1A and 1B when viewed from the top.

In the above-described unique construction, a signal current (DC current) flows through the hot conductor pattern 31. In this way a conductor pattern to which the signal current flows is called hot conductor pattern. On the other hand, noise current (high-frequency current) entering the hot conductor pattern 31 flows to a ground through the inside of the two two-terminal capacitors 1A and 1B. That is, nearly one half of the noise current flows through the two-terminal capacitor 1A, the grounding conductor pattern G1, the through-hole 34a, the grounding conductor pattern G (essentially the left half side in FIG. 2), and the common through-hole 35, and the rest of the noise current flows through the two-terminal capacitor 1B, the grounding conductor pattern G2, the through-hole 34b, the grounding conductor pattern G (essentially the right half side in FIG. 2), and the common through-hole 35.

Here, since the two two-terminal capacitors 1A and 1B are mounted such that the capacitors 1A and 1B face each other so as to be symmetrical with respect to the hot conductor pattern 31, noise currents Ia and Ib of the nearly same amplitude flow in the two-terminal capacitors 1A and 1B in the opposite left and right directions, respectively. In this way, the magnetic fields generated by the noise currents Ia and Ib, respectively, cancel each other out. As a result of this, the equivalent series inductance generated by the two two-terminal capacitors 1A and 1B is not reduced to one half, but can be reduced to nearly one third or less than one third of that of the related device. Therefore, the number of capacitors to be mounted in the circuit board 30 can be reduced.

Figure 3:
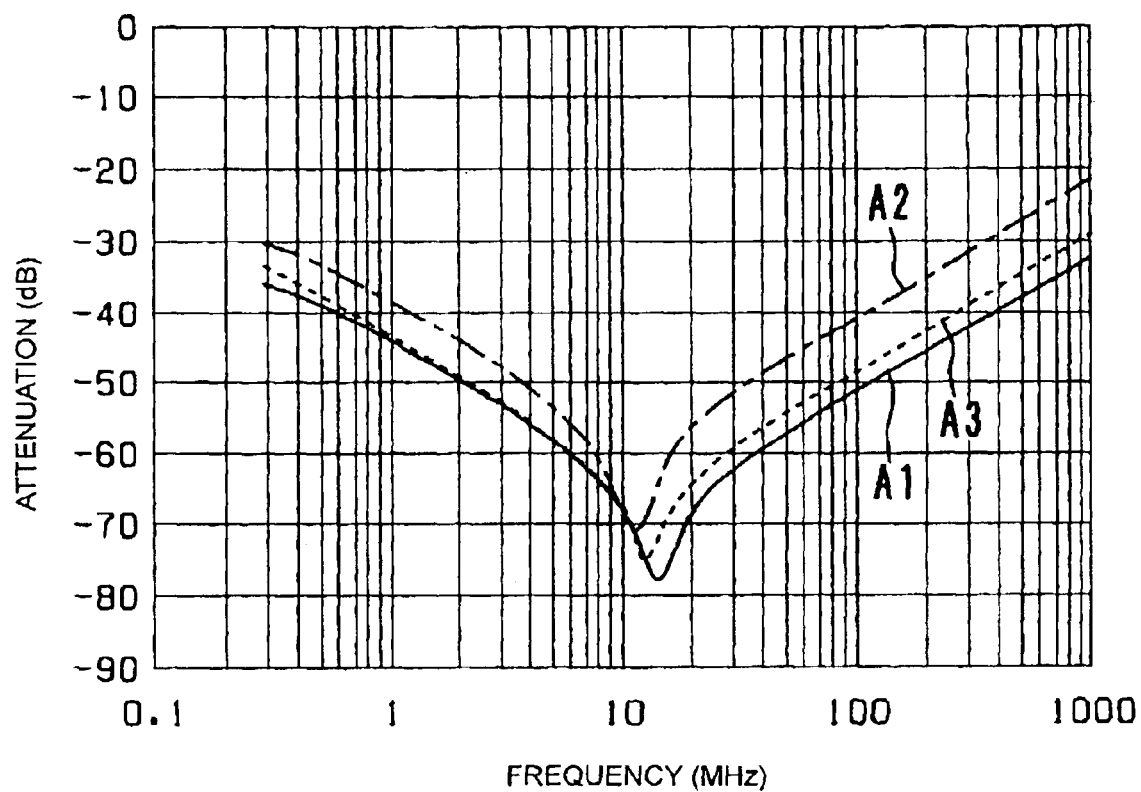
FIG. 3 is a graph showing the characteristics of insertion loss.
Figure 15:
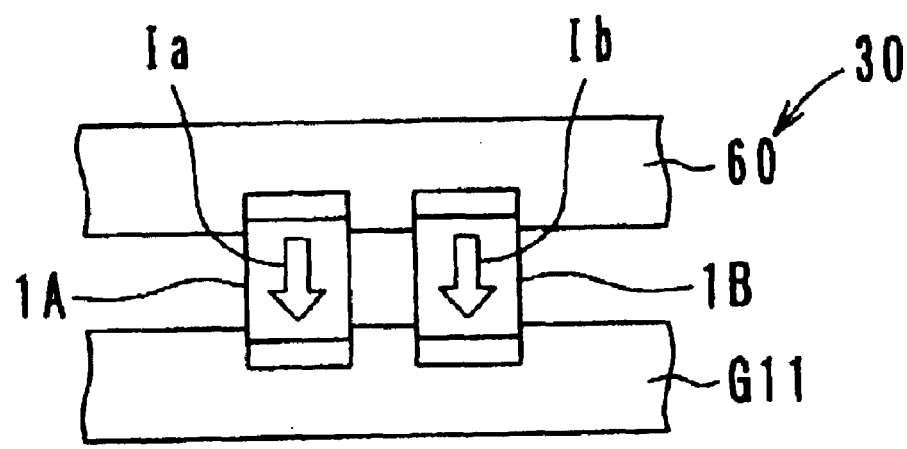
FIG. 15 is a top view showing a related mounting structure of capacitors.

FIG. 3 shows the characteristics of insertion loss of the two two-terminal capacitors 1A and 1B (see solid line A1) disposed so that the noise currents Ia and Ib flowing therein may be in opposite direction to each other. In FIG. 3, the characteristics of insertion loss of one of the two-terminal capacitors 1A and 1B (see alternating long and short dashed line A2) and the characteristics of insertion loss of the related two two-terminal capacitors (see dotted line A3) connected in parallel as in FIG. 15 are shown for comparison.

Moreover, in the present first preferred embodiment, the circuit board 30, on which the two-terminal capacitors 1A and 1B are mounted, is preferably a multilayer board, and the grounding conductor patterns G1, G2, and G and through-holes 34a, 34b, and 35 are arranged so as to be substantially symmetrical with respect to the hot conductor pattern 31. Accordingly, the magnetic fields generated by the noise currents Ia and Ib flowing in the two-terminal capacitors 1A and 1B and the magnetic fields generated by the noise currents Ic, Id, Ie, and If flowing in the grounding conductor patterns G1, G2, and G in the circuit board 30, are canceled out by each other.

That is, the total of the magnetic fields generated by the noise current Ia flowing in the two-terminal capacitor 1A and the noise current Ic flowing in the grounding conductor pattern G1 and the magnetic field generated by the noise current Ie flowing in the grounding conductor pattern G (essentially the left half side in FIG. 2) cancel each other out. In the same way, the total of the magnetic fields generated by the noise current Ib flowing in the two-terminal capacitor 1B and the noise current Id flowing in the grounding conductor pattern G2 and the magnetic field generated by the noise current If flowing in the grounding conductor pattern G (essentially the right half side in FIG. 2) cancel each other out. As a result of this, the total equivalent series inductance of the two-terminal capacitors 1A and 1B and the circuit board 30 can be greatly reduced.

Figure 4:
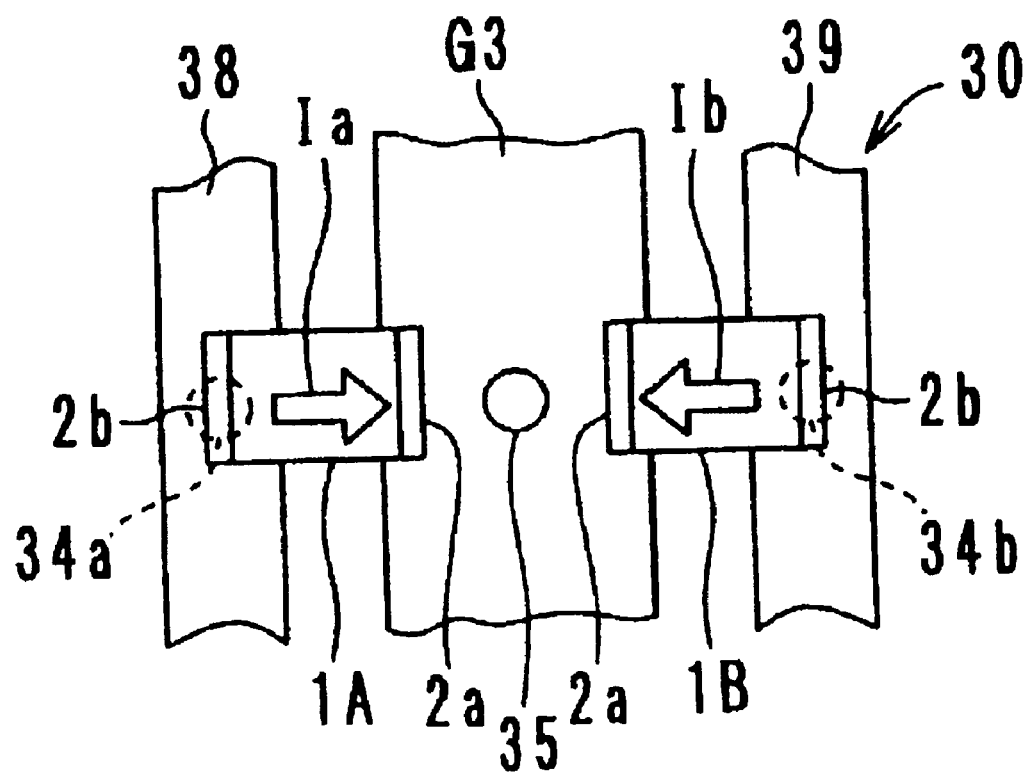
FIG. 4 is a top view showing a modified example of the first preferred embodiment of the present invention.
Figure 5:
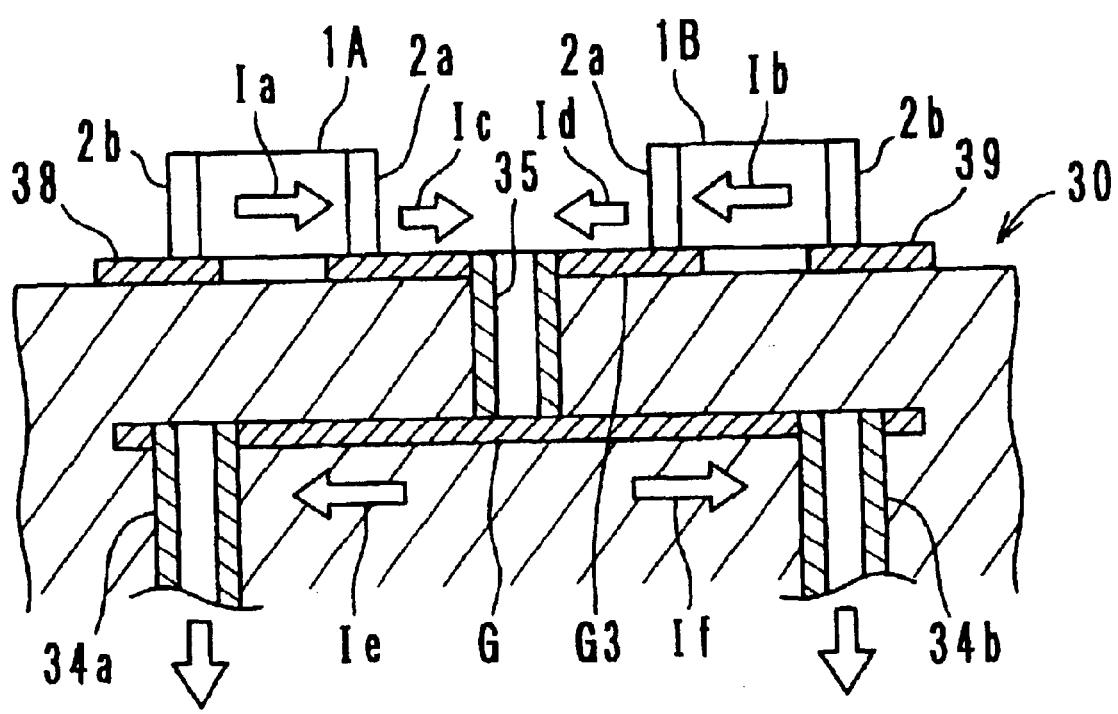
FIG. 5 is a sectional view of the mounting structure of capacitors shown in FIG. 4.

Furthermore, as shown in FIGS. 4 and 5, two hot conductor patterns (second conductor patterns) 38 and 39 may be arranged so as to interpose a grounding conductor pattern (first conductor pattern) G3 therebetween. A common through-hole 35 is disposed in the middle of the grounding conductor pattern G provided inside the circuit board 30. The through-holes 34a and 34b are disposed at locations at nearly the same distance from the common through-hole 35 and of the two two-terminal capacitors 1A and 1B when viewed from the top. The noise currents entering the hot conductor patterns 38 and 39 flow in the two two-terminal capacitors 1A and 1B and become one current through the grounding conductor pattern G3 and the common through-hole 35, and then the one current is once again divided into two and the divided currents flow into the through-holes 34a and 34b, respectively.

Here, since the two two-terminal capacitors 1A and 1B are mounted so as to be symmetrical with respect to the grounding conductor pattern G3, the noise currents Ia and Ib of nearly the same amplitude flow in the two-terminal capacitors 1A and 1B in the opposite left and right directions, respectively. In this way, the magnetic fields generated by the noise currents Ia and Ib cancel each other out. As a result, the equivalent series inductance generated by the two two-terminal capacitors 1A and 1B can be reduced to nearly one third or less than one third.

Moreover, the total of the magnetic fields generated by the noise current Ia flowing in the two-terminal capacitor 1A and the noise current Ic flowing in the grounding conductor pattern G3 (essentially the left half side in FIG. 5) and the magnetic field generated by the noise current Ie flowing in the grounding conductor pattern G (essentially the left half side in FIG. 5) cancel each other out. In the same way, the total of the magnetic fields generated by the noise current Ib flowing in the two-terminal capacitor 1B and the noise current Id flowing in the grounding conductor pattern G3 (essentially the right half side in FIG. 5) and the magnetic field generated by the noise current If flowing in the grounding conductor pattern G (essentially the right half side in FIG. 5) cancel each other out. As a result of this, the total equivalent series inductance of the two-terminal capacitors 1A and 1B and the circuit board 30 is greatly reduced.

Second Preferred Embodiment, FIGS. 6 to 11

Figure 6:
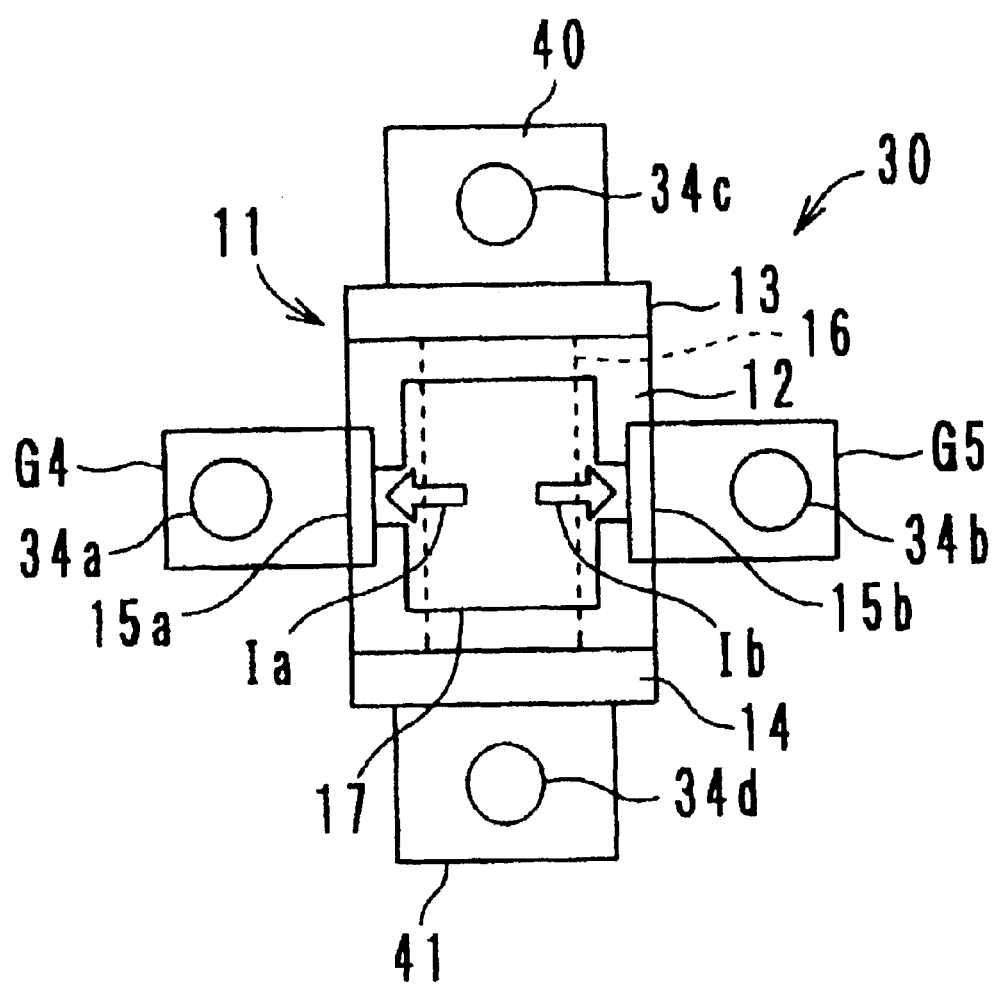
FIG. 6 is a top view showing a second preferred embodiment of a mounting structure of a capacitor according to the present invention.
Figure 7:
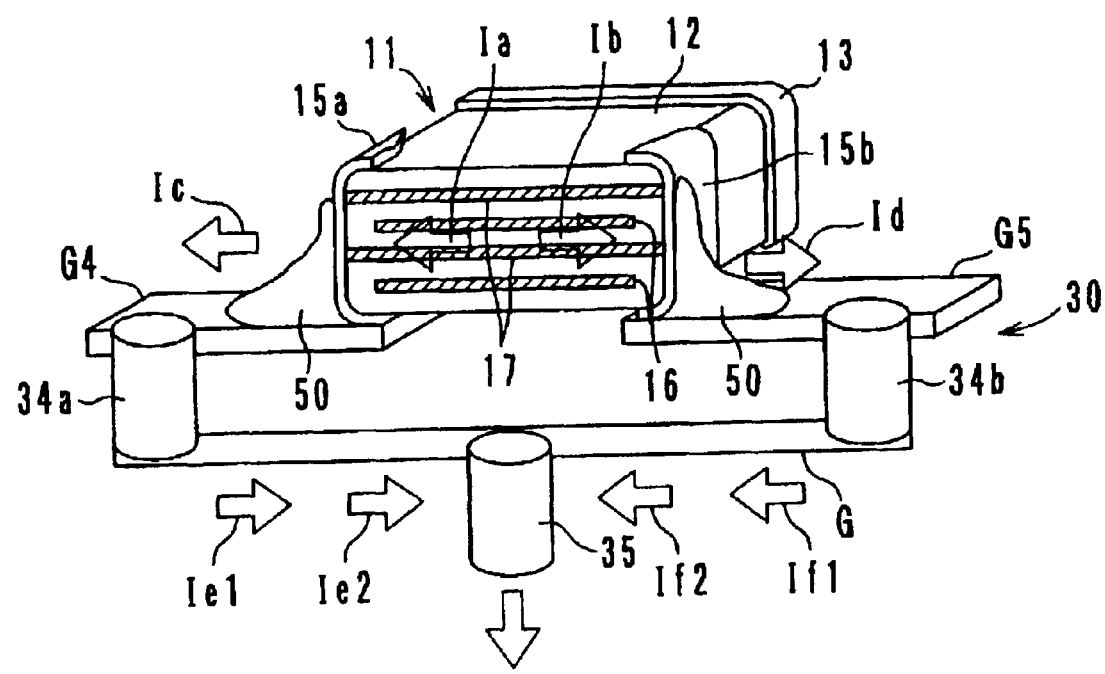
FIG. 7 is a sectional view of the mounting structure of a capacitor shown in FIG. 6.

FIG. 6 is a top view showing a preferred embodiment of a three-terminal capacitor mounting structure to be used for eliminating noise current, and FIG. 7 is a sectional view thereof. A lamination type three-terminal capacitor 11 is mounted on the surface of the circuit board 30 by soldering 50 or other suitable process.

In the three-terminal capacitor 11, a first external terminal 13 and a second external terminal 14 are provided on both ends of a ceramic element (chip element) preferably having the form of a substantially rectangular solid which is made of a ceramic material, and internal electrodes 17 and through electrodes 16 are provided inside the ceramic element 12. Each of the internal electrodes 17 is connected to third external terminals 15a and 15b which are provided on both ends of the ceramic element 12, and the first external terminal 13 and the second external terminal 14 are electrically connected by the through electrode 16.

On the surface of the circuit board 30, hot connection lands (hot conductor patterns) 40 and 41, to which the first external terminal 13 and the second external terminal 14 of the three-terminal capacitor 11 are electrically connected, and grounding connection lands (grounding conductor patterns) G4 and G5, to which third external terminals 15a and 15b are to be electrically connected, are provided.

The hot conductor pattern (not illustrated) and the grounding conductor pattern G are generally laminated in different layers inside the circuit board 30. The hot conductor pattern and grounding conductor pattern G inside the circuit board 30 may be a line with a relatively small conductor width or may be a large flat area. The grounding conductor pattern G is electrically connected to the grounding connection lands G4 and G5 by the through-holes 34a and 34b provided in the circuit board 30. The hot conductor pattern is electrically connected to the hot connection lands 40 and 41 by the through-holes 34c and 34d provided in the circuit board 30.

It is desirable that the through-holes 34a and 34b are disposed so as to be substantially symmetrical with respect of the common through-hole 35. Furthermore, it is desirable that the third external terminals 15a and 15b of the three-terminal capacitor 11 are located substantially at the same distance from the through-holes 34a and 34b, respectively.

A signal current (DC current) flows through the through electrodes 16 of the three-terminal capacitor 11. On the other hand, noise currents (high-frequency currents) entering the through electrodes 16 flow to the ground through the internal electrodes 17. That is, substantially one half of the noise currents flows through the internal electrodes 17 (essentially the left half side in FIG. 7) of the three-terminal capacitor 11, the third external terminal 15a, the grounding connection land G4, the through-hole 34a, the grounding conductor pattern G (essentially the left half side in FIG. 7), and the common through-hole 35, and the rest of the noise currents flows through the internal electrodes 17 (essentially the right half side in FIG. 7) of the three-terminal capacitor 11, the third external terminal 15b, the grounding connection land G5, the through-hole 34b, the grounding conductor pattern G (essentially the right half side in FIG. 7), and the common through-hole 35.

Figure 8:
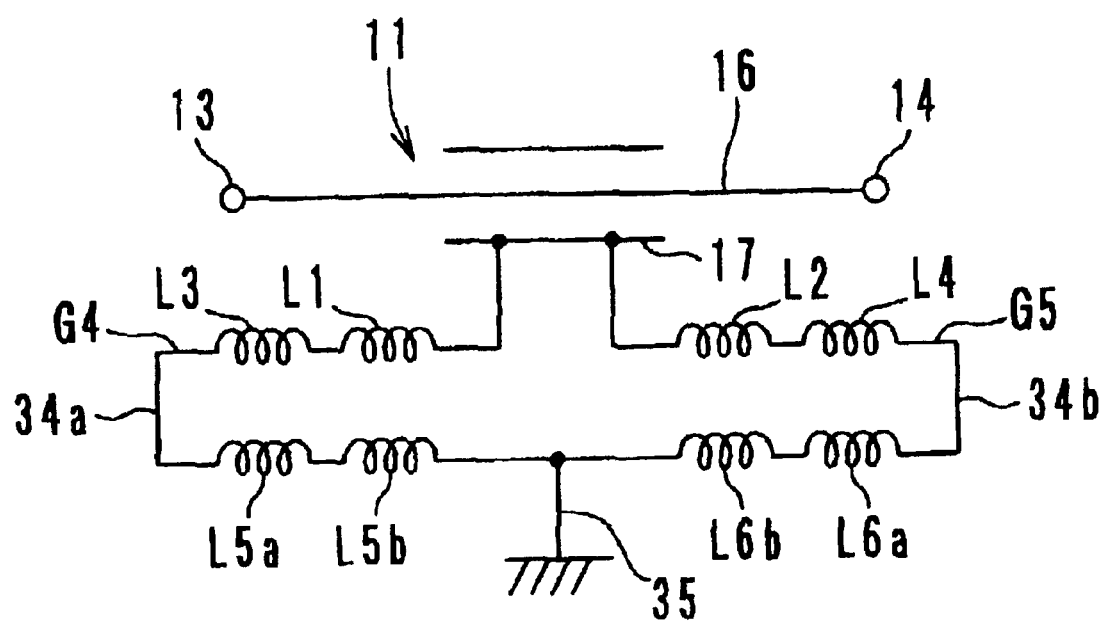
FIG. 8 is an electrical equivalent circuit diagram of the mounting structure of a capacitor shown in FIG. 6.

FIG. 8 is an electrical equivalent circuit diagram of the mounting structure for the three-terminal capacitor 11. In FIG. 8, L1 and L2 are equivalent series inductances based on the magnetic fields generated by the noise currents Ia and Ib flowing in the left and right directions in the three-terminal capacitor 11. L3 and L4 are equivalent series inductances based on the magnetic fields generated by the noise currents Ic and Id flowing in the grounding connection lands G4 and G5. L5a is an equivalent series inductance based on the magnetic field generated by a noise current Ie1 flowing in a portion (the portion on the left side from below the three-terminal capacitor 11) opposite to the grounding connection land G4 of the grounding conductor pattern G (essentially the left half side). L5b is an equivalent series inductance based on the magnetic field generated by a noise current Ie2 flowing in a portion (portion on the left side from below the three-terminal capacitor 11) not opposite to the grounding connection land G4 of the grounding conductor pattern G (essentially the left half side). L6a is an equivalent series inductance based on the magnetic field generated by a noise current If1 flowing in a portion (the portion on the right side from below the three-terminal capacitor 11) opposite to the grounding connection land G5 of the grounding conductor pattern G (essentially the right half side). L6b is an equivalent series inductance based on the magnetic field generated by a noise current If2 flowing in a portion (the portion on the right side from below the three-terminal capacitor 11) that is not opposite to the grounding connection land G5 of the grounding conductor pattern G (essentially the right half side).

Here, in FIG. 7, parts of the magnetic fields generated by the noise current Ia flowing to the left and the noise current Ib flowing to the right in the three-terminal capacitor 11 (that is, parts of the equivalent series inductances L1 and L2) cancel each other out (this is the same as in the related three-terminal capacitor). Furthermore, the magnetic fields generated by the noise current Ic flowing in the grounding connection land G4 and the noise current Ie1 flowing in a portion, which is opposite to the grounding connection land G4, of the grounding conductor pattern G (that is, the equivalent series inductances L3 and L5) cancel each other out. Furthermore, the magnetic fields generated by the rest of the noise current Ia and the noise current Ie2 flowing in a portion, that is not opposite to the grounding connection land G4, of the grounding conductor pattern G (that is, the rest of the equivalent series inductance L1 and Lb5) cancel each other out.

In the same way, the magnetic fields generated by the noise current Id flowing in the grounding connection land G5 and the noise current If1 flowing in a portion, opposite to the grounding connection land G5, of the grounding conductor pattern G (that is, the equivalent series inductances L4 and L6a) cancel each other out. Furthermore, the magnetic fields generated by the rest of the noise current Ib and the noise current If2 flowing in a portion, that is not opposite to the grounding connection land G5, of the grounding conductor pattern G (that is, the rest of the equivalent series inductance L2 and L6b) cancel each other out. Moreover, the magnetic fields generated by the rest of the noise current Ie2 and the rest of the noise current If2 (that is, the rest of the equivalent series inductance and the rest of Lb6) cancel each other out.

As a result, the total equivalent series inductance of the three-terminal capacitor 11 and the circuit board 30 can be reduced to substantially one half or less than one half of that of the related one.

Figure 9:
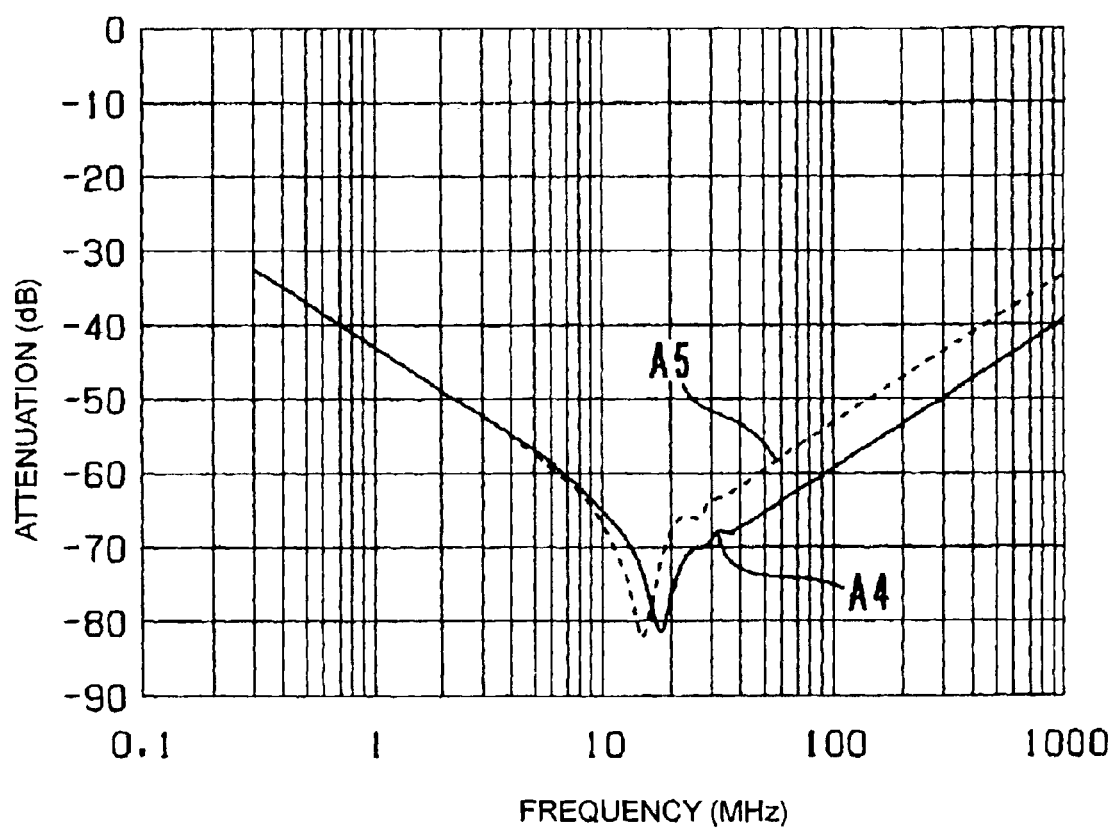
FIG. 9 is a graph showing the characteristics of insertion loss.

FIG. 9 shows the characteristics of insertion loss of the three-terminal capacitor 11 of the present second preferred embodiment (see solid line A4). The characteristics of insertion loss of the related three-terminal capacitor mounting structure (see dotted line A5) is also shown for comparison.

Figure 10:
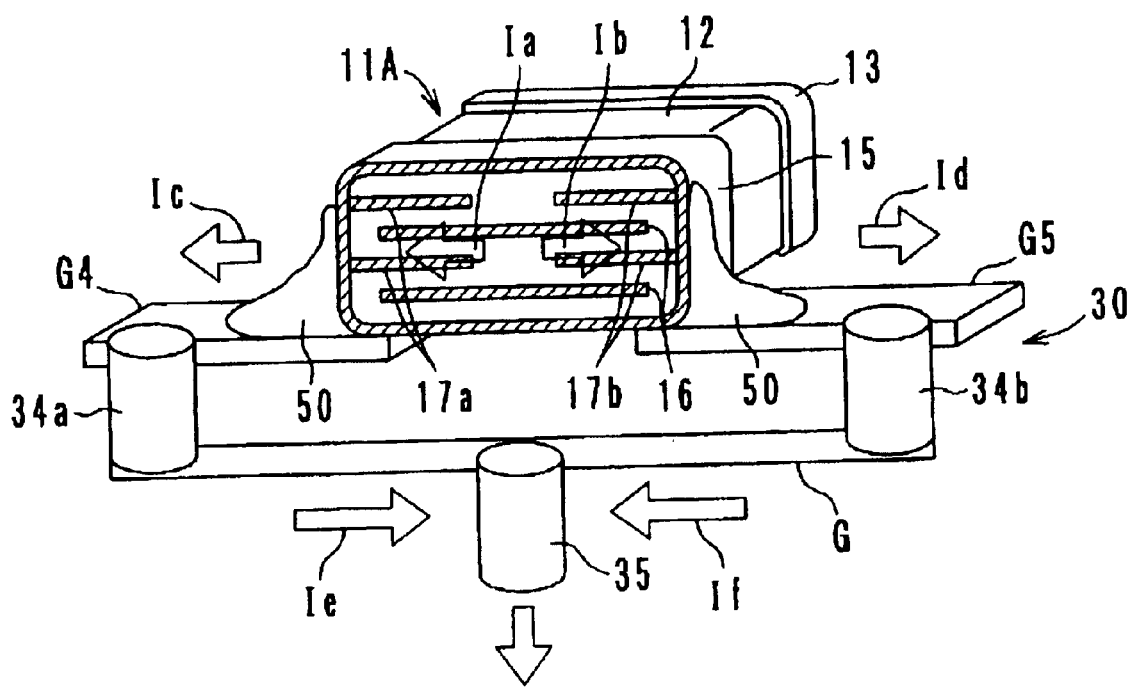
FIG. 10 is a sectional view showing a modified example of the second preferred embodiment of the present invention.
Figure 11:
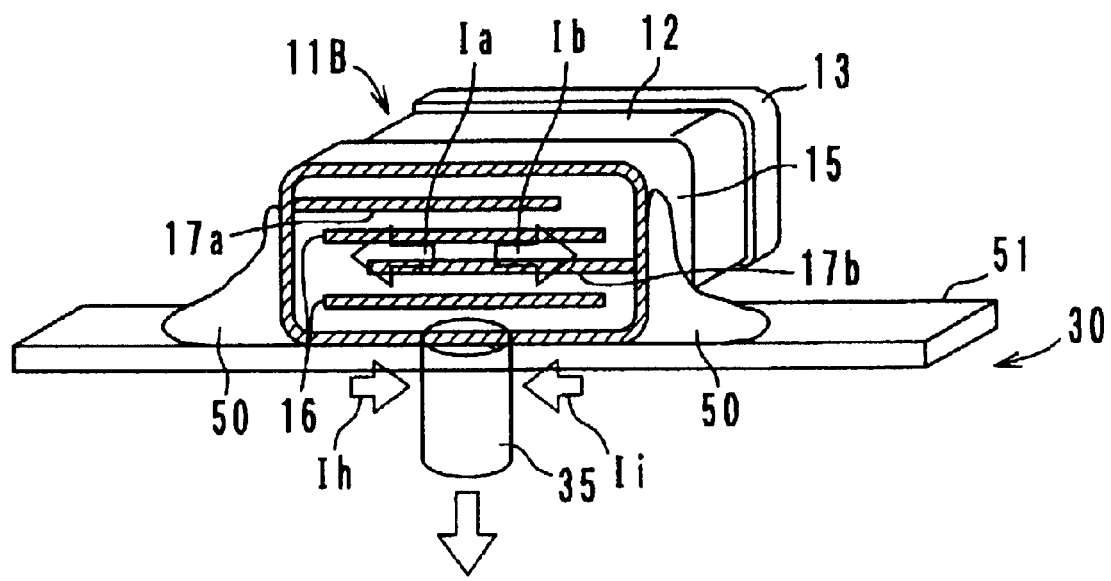
FIG. 11 is a sectional view showing another modified example of the second preferred embodiment of the present invention.

Furthermore, in the three-terminal capacitor, internal electrodes 17a and 17b may be arranged so as to be opposite to each other in the same layer as shown in FIG. 10, and the internal electrodes 17a and 17b may be alternately provided in separate layers as shown in FIG. 11. These three-terminal capacitors 11A and 11B also give the same effect as the three-terminal capacitor 11.

Moreover, as shown in FIG. 11, the third external terminal to be connected to the ground is arranged to define a surrounding third external terminal 15 which wraps the middle trunk portion of the capacitor and may be electrically connected to the common through-hole 35 located under the middle of the lower surface of the third external terminal 15 through a grounding connection land 51.

In this way, parts of the magnetic fields generated by the noise current Ia flowing to the left and the noise current Ib flowing to the right in the three-terminal capacitor 11B cancel each other out (this is the same as in the related three-terminal capacitor). Furthermore, the magnetic fields generated by the rest of the noise current Ia and a noise current Ih flowing in a substantially left half portion of a grounding connection land 51 cancel each other out. In the same way, the magnetic fields generated by the rest of the noise current Ib and a noise current Ii flowing in a substantially right half portion of the grounding connection land 51 cancel each other out. Moreover, the magnetic fields generated by the rest of the noise current Ih and the rest of the noise current Ii cancel each other out. As a result, the total equivalent series inductance of the three-terminal capacitor 11B and the circuit board 30 can be reduced.

Other Preferred Embodiments

Moreover, the mounting structure of capacitors according to the present invention is not limited to the above-described preferred embodiments, but it can be variously modified within the true spirit and scope of the present invention. For example, the grounding conductor pattern is not necessarily required to be disposed inside the circuit board and may be provided on the rear surface of the circuit board 30. Also in this case, the electrical connection to the grounding conductor patterns G1 to G3 and grounding connection lands G4 and G5 provided on the surface of the circuit board 30 is performed by the through-holes. Furthermore, the chip element is not limited to laminated ceramic capacitors, but may be laminated capacitors made of resin materials and composite materials. The circuit board 30 may be made of glass ceramics, resin, composite materials, or other suitable materials.

Figure 12:
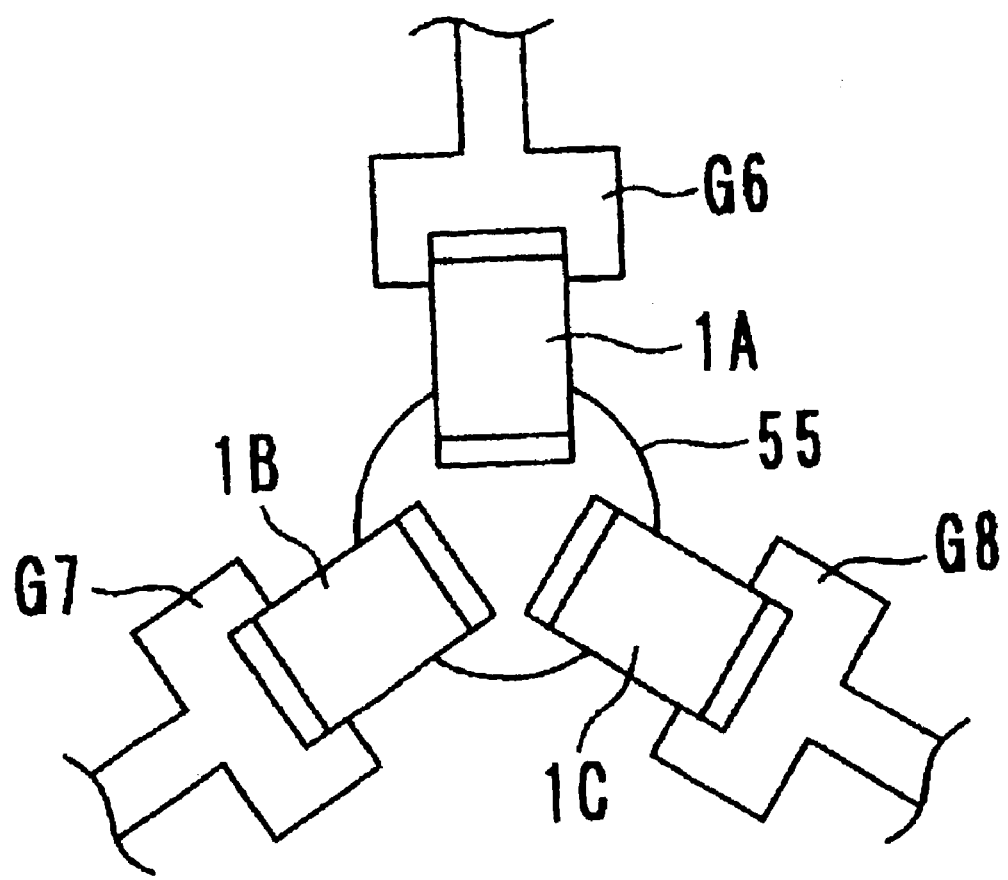
FIG. 12 is a top view showing another preferred embodiment of the present invention.

Furthermore, in the first preferred embodiment, when three or more two-terminal capacitors are mounted, the capacitors can be arranged so that the sum of directional vectors of noise currents may be zero. For example, as shown in FIG. 12, when three two-terminal capacitors 1A to 1C are mounted, the capacitors may be radially disposed and spaced approximately 120 degrees away from each other. In FIG. 12, reference numeral 55 represents a hot conductor pattern and reference numerals G6 to G8 represent grounding conductor patterns.

Figure 13:
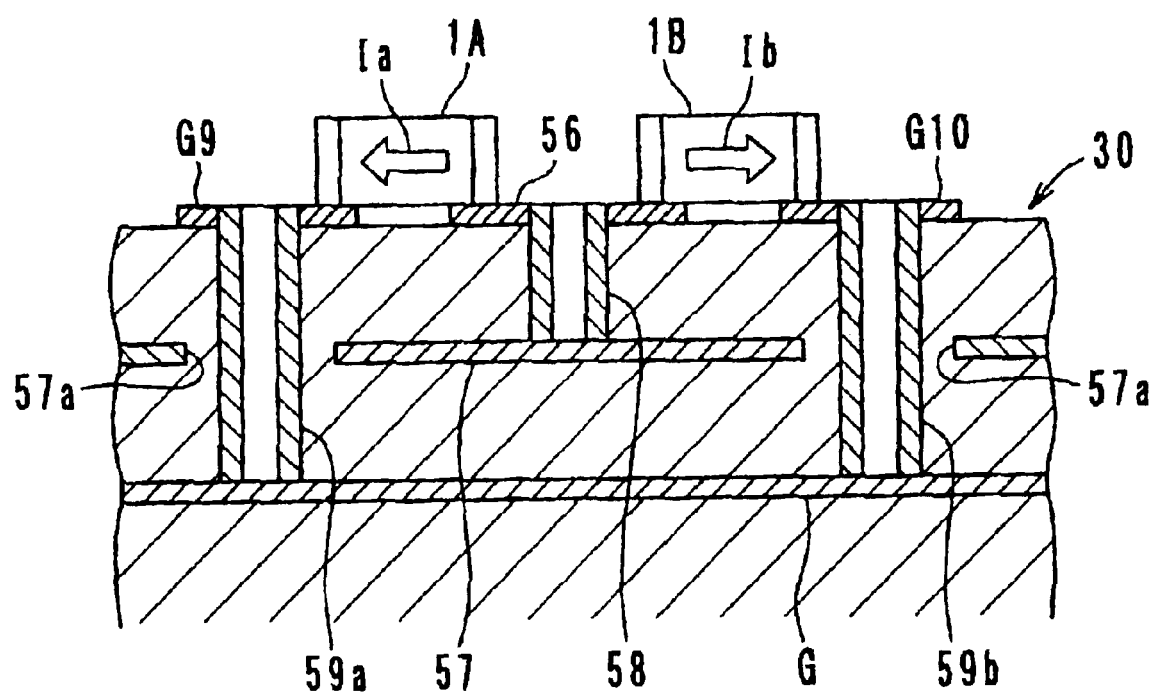
FIG. 13 is a sectional view showing another preferred embodiment of the present invention.

Furthermore, in FIG. 13, a hot connection land 56 and grounding connection lands G9 and G10 are electrically connected to a hot conductor plate 57 of a large area and a grounding conductor plate G provided in different layers inside the circuit board 30 by the through-holes 58 and 59. The through-holes 59a and 59b are prevented from being short-circuited to the hot conductor plate 57 such that the through-holes 59a and 59b are made to pass through holes 57a of a large area.

Figure 14:
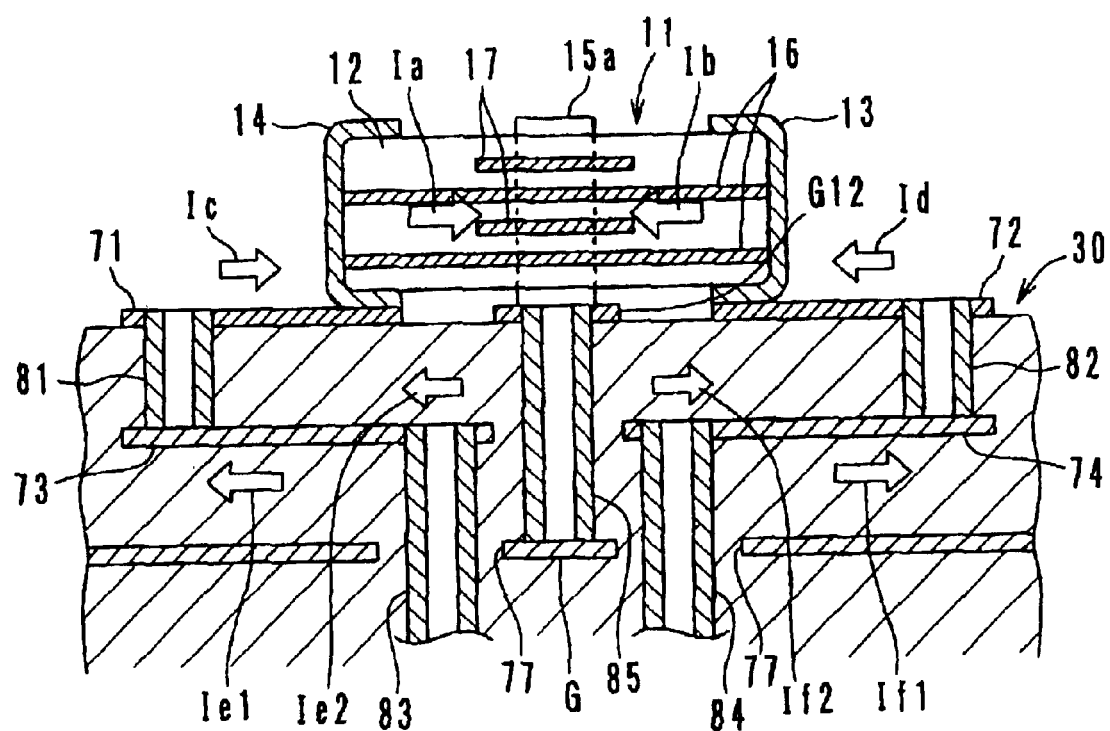
FIG. 14 is a sectional view showing another preferred embodiment of the present invention.

Furthermore, FIG. 14 is a sectional view showing another preferred embodiment of a three-terminal capacitor mounting structure to be used for eliminating noise current. The lamination type three-terminal capacitor 11 is mounted on the surface of the circuit board 30 by soldering or other suitable process. The three-terminal capacitor 11 is the same as what is described in the second preferred embodiment and its detailed description is omitted. On the surface of the circuit board 30, hot connection lands 71 and 72, to which the first external terminal 13 and the second external terminal 14 of the three-terminal capacitor 11 are electrically connected, and a grounding connection land G12 (the connection land, to which the third external terminal is electrically connected, is not illustrated), to which third external terminals 15a and 15b are electrically connected, are provided.

Inside the circuit board 30, hot conductor patterns 73 and 74 of a line with a relatively small conductor width and a grounding conductor pattern G with a large flat area are generally laminated in different layers. The grounding conductor pattern G is electrically connected to a grounding connection land G12 by a through-hole 85 provided in the circuit board 30. The through-holes 83 and 84 connected to the other end of the hot conductor patterns 73 and 74 are prevented from being short-circuited to the grounding conductor pattern G such that the through-holes 83 and 84 are made to pass through holes 77, which are large in diameter, provided in the grounding conductor pattern G.

It is desirable that the through-holes 81 and 83 and the through-holes 82 and 84 are disposed so as to be substantially symmetrical with respect to the location of the through-hole 85. Furthermore, it is desirable that the first external terminal 13 and the second external terminal 14 of the three-terminal capacitor 11 are positioned to be substantially equal in distance from the through-holes 81 and 82.

The noise current (high-frequency current) entering the through electrodes 16 via the second external terminal 14 flows through the through-hole 83 of the circuit board 30, the hot conductor pattern 73, the through-hole 81, the hot connection land 71, the second external terminal 14, the through electrodes 16, the internal electrodes 17, the third external terminals 15a and 15b, the through-hole 85, and the grounding conductor pattern G. On the other hand, the noise current (high-frequency current) entering the through electrodes 16 via the first external terminal 13 flows through the through-hole 84 of the circuit board 30, the hot conductor pattern 74, the through-hole 82, the hot connection land 72, the first external terminal 13, the through electrodes 16, the internal electrodes 17, the third external terminals 15a and 15b, the through-hole 85, and the grounding conductor pattern G.

Here, in FIG. 14, portions of the magnetic fields generated by the noise current Ia flowing to the right and the noise current to the left in the three-terminal capacitor 11 cancel each other out (this is the same as in the related three-terminal capacitor). Furthermore, the magnetic fields generated by the noise current Ic flowing in the hot connection land 71 and the noise current Ie1 flowing in a portion, opposite to the hot connection land 71, of the hot conductor pattern 73 cancel each other out. Furthermore, the magnetic fields generated by the rest of the noise current Ia and the noise current Ie2 flowing in a portion, not opposite to the hot connection land 71, of the hot conductor pattern 73 cancel each other out.

In the same way, the magnetic fields generated by the noise current Id flowing in the hot connection land 72 and the noise current If1 flowing in a portion, opposite to the hot connection land 72, of the hot conductor pattern 74 cancel each other out. Furthermore, the magnetic fields generated by the rest of the noise current Ib and the noise current If2 flowing in a portion, not opposite to the hot connection land 72, of the hot conductor pattern 74 cancel each other out. Moreover, the magnetic fields generated by the rest of the noise current Ie2 and the rest of the noise current If2 cancel each other out.

As a result, the total equivalent series inductance of the three-terminal capacitor 11 and the circuit board 30 is greatly reduced. Furthermore, a three-terminal capacitor may be constructed such that the structure of the hot conductor pattern in FIG. 14 and the structure of the grounding conductor pattern of the first and second preferred embodiments are combined together.

Furthermore, in addition to the through-holes (conductive paste is put on the inner surface of the holes), via holes (the inside holes are filled with conductive paste) may be used as the electrical connector provided inside the circuit board.

As is clear in the above description, according to various preferred embodiments of the present invention, since the noise current flowing in capacitors and the noise current flowing in a grounding conductor pattern of a circuit board are set to be in opposite directions relative to each other, the magnetic fields generated by these noise currents cancel each other out. As a result, a mounting structure, in which the mounting space and cost are reduced and the equivalent series inductance of the capacitors and the circuit board is greatly reduced, can be obtained.

It should be understood that the foregoing description is only illustrative of the present invention. Various alternatives and modifications can be devised by those skilled in the art without departing from the present invention. Accordingly, the present invention is intended to embrace all such alternatives, modifications and variances which fall within the scope of the appended claims.

What is claimed is:

1. A capacitor mounting structure comprising:
   a circuit board including a first conductor pattern and at least two second conductor patterns arranged so as to interpose the first conductor pattern therebetween; and
   at least two capacitors having at least a first external terminal and a second external terminal provided on both ends of the at least two capacitors, respectively, the at least two capacitors being mounted on the circuit board;
   wherein the first external terminal of each of the at least two capacitors is electrically connected to the first conductor pattern, the second external terminal of one of the at least two capacitors is electrically connected to one of the two second conductor patterns, and the second external terminal of the other of the at least two capacitors is electrically connected to the other of the two second conductor patterns such that noise currents flowing in the at least two capacitors are in opposite directions relative to each other with respect to the first conductor pattern or the sum of directional vectors of the noise currents are zero.

2. A capacitor mounting structure according to claim 1, wherein the capacitor mounting structure is a two-terminal capacitor mounting structure.

3. A capacitor mounting structure according to claim 1, wherein the at least two capacitors are chip elements.

4. A capacitor mounting structure according to claim 3, wherein each of the chip elements defining the at least two capacitors has a longitudinal axis and the first and second external terminals are disposed at opposite ends of the longitudinal axis.

5. A capacitor mounting structure according to claim 1, wherein a grounding conductor pattern is provided at least either inside the circuit board or on a rear surface of the circuit board.

6. A capacitor mounting structure according to claim 5, wherein the grounding conductor pattern is electrically connected to at least one of the first conductor pattern and second conductor patterns, and to grounding external terminals of the at least two capacitors via an electrical connector provided inside the circuit board such that the direction of noise currents flowing in the grounding conductor pattern is opposite to the direction of noise currents flowing in the at least two capacitors to each other or the sum of directional vectors of the noise currents is zero.

7. A capacitor mounting structure according to claim 5, further comprising a plurality of conductive through holes formed in the circuit board and electrically connected to the grounding conductor pattern.

8. A capacitor mounting structure according to claim 7, wherein at least two of the conductive through holes are electrically connected to the at least two second conductor patterns at one end thereof and are electrically connected to the grounding conductor pattern at opposite ends thereof.

9. A capacitor mounting structure according to claim 7, wherein at least one of the plurality of conductive through holes is located below the others of the plurality of conductive through holes in the circuit board.

10. A capacitor mounting structure comprising:
a circuit board including hot conductor patterns and a grounding conductor pattern; and
at least one capacitor mounted on the circuit board, said at least one capacitor including through electrodes and internal electrodes arranged to face the through electrodes, a first external terminal and a second external terminal provided on both ends of the at least one capacitor respectively and electrically connected to the through electrodes, and third external terminals provided on side surfaces of the at least one capacitor and electrically connected to the internal electrodes;
wherein the first external terminal and the second external terminal of the at least one capacitor are electrically connected to the hot conductor patterns, the grounding conductor pattern is provided either inside the circuit board or on a rear surface of the circuit board, and the grounding conductor pattern is electrically connected to the third external terminals of the at least one capacitor via an electrical connector provided inside the circuit board such that the direction of noise currents flowing in the grounding conductor pattern is opposite to the direction of noise currents flowing in the at least one capacitor relative to each other.

11. A capacitor mounting structure according to claim 10, wherein the capacitor mounting structure is a three-terminal capacitor mounting structure.

12. A capacitor mounting structure according to claim 10, wherein the at least one capacitor is a chip element.

13. A capacitor mounting structure according to claim 12, wherein the chip element defining the at least one capacitor has a longitudinal axis and the first and second external terminals are disposed at opposite ends of the longitudinal axis and the third external terminals are disposed between the first and second external terminals along the longitudinal axis of the chip element.

14. A capacitor mounting structure according to claim 10, wherein the electrical connector includes a plurality of conductive through holes formed in the circuit board and electrically connected to the grounding conductor pattern.

15. A capacitor mounting structure according to claim 14, wherein at least two of the conductive through holes which are electrically connected to the third external terminals at one end thereof and are electrically connected to the grounding conductor pattern at opposite ends thereof.

16. A capacitor mounting structure according to claim 14, wherein at least one of the plurality of conductive through holes is located below the others of the plurality of conductive through holes in the circuit board.

17. A capacitor mounting structure comprising:
a circuit board including hot conductor patterns and a grounding conductor pattern; and
at least one capacitor mounted on the circuit board, said at least one capacitor including through electrodes and internal electrodes arranged to face the through electrodes, a first external terminal and a second external terminal provided on both ends of the at least one capacitor respectively and electrically connected to the through electrodes, and third external terminals provided on side surfaces of the at least one capacitor and electrically connected to the internal electrodes;
wherein the third external terminals of the at least one capacitor are electrically connected to the grounding conductor pattern, the hot conductor patterns are provided either inside the circuit board or on a rear surface of the circuit board, and the hot conductor patterns are electrically connected to the first external terminal and the second external terminal of the three-terminal capacitor via an electrical connector provided inside the circuit board such that the direction of noise currents flowing in the hot conductor patterns is opposite to the direction of noise currents flowing in the at least one capacitor relative to each other.

18. A capacitor mounting structure according to claim 17, wherein the capacitor mounting structure is a three-terminal capacitor mounting structure.

19. A capacitor mounting structure according to claim 17, wherein the at least one capacitor is a chip element.

20. A capacitor mounting structure according to claim 19, wherein the chip element defining the at least one capacitor has a longitudinal axis and the first and second external terminals are disposed at opposite ends of the longitudinal axis and the third external terminals are disposed between the first and second external terminals along the longitudinal axis of the chip element.

21. A capacitor mounting structure according to claim 17, wherein the electrical connector includes a plurality of conductive through holes disposed in the circuit board and electrically connected to the grounding conductor pattern.

22. A capacitor mounting structure according to claim 21, wherein at least two of the conductive through holes which are electrically connected to the hot conductor patterns at one end thereof and are electrically connected to the grounding conductor pattern at opposite ends thereof.

23. A capacitor mounting structure according to claim 21, wherein at least one of the plurality of conductive through holes is located below the others of the plurality of through holes in the circuit board.

24. A capacitor mounting structure comprising:
a circuit board including a grounding conductor pattern and at least two grounding electrodes; and
at least one capacitor mounted on the circuit board, said at least one capacitor including through electrodes and internal electrodes arranged to face the through electrodes, a first external terminal and a second external terminal provided on both ends of the at least one capacitor respectively and electrically connected to the through electrodes, and third external terminals provided on side surfaces of the at least one capacitor and electrically connected to the internal electrodes;
wherein the at least one capacitor is located between the at least two grounding electrodes and the at least two grounding electrodes are electrically connected to the at least one capacitor via the third external terminals, the grounding conductor pattern is located adjacent to the at least two grounding electrodes and is electrically connected thereto, a conductive through hole is located in the circuit board at an approximate central portion of the grounding conductor pattern and the conductive through hole is electrically connected to the grounding conductor pattern such that the direction of noise currents flowing in the grounding conductor pattern is opposite to the direction of noise currents flowing in the at least one capacitor relative to each other.

25. A capacitor mounting structure according to claim 24, wherein the grounding conductor pattern is located within the circuit board and the at least two grounding electrodes are located on a surface of the circuit board adjacent to the at least one capacitor.

26. A capacitor mounting structure according to claim 24, wherein the capacitor mounting structure is a three-terminal capacitor mounting structure.

27. A capacitor mounting structure according to claim 24, wherein the conductive through hole is located below the capacitor such that the magnetic fields generated by the noise currents flowing in said at least two grounding electrodes and the magnetic fields generated by the noise currents flowing in said grounding conductor pattern cancel each other out.

28. A capacitor mounting structure according to claim 27, wherein the chip element defining the at least one capacitor has a longitudinal axis and the first and second external terminals are disposed at opposite ends of the longitudinal axis and the third external terminals are disposed between the first and second external terminals along the longitudinal axis of the chip element.

29. A capacitor mounting structure according to claim 24, further comprising at least two conductive through holes provided in the circuit board so as to electrically connect the at least two grounding electrodes to the grounding conductor pattern.

30. A capacitor mounting structure according to claim 29, wherein the conductive through hole located at an approximate central portion of the grounding conductor pattern is located below the at least two conductive through holes that electrically connect the at least two grounding electrodes to the grounding conductor pattern.

* * * * *